(12) United States Patent
Hofmann et al.

(10) Patent No.: US 7,180,115 B1
(45) Date of Patent: Feb. 20, 2007

(54) DRAM CELL STRUCTURE WITH TUNNEL BARRIER

(75) Inventors: Franz Hofmann, Munich (DE); Wolfgang Roesner, Ottobrunn (DE); Lothar Risch, Neubiberg (DE); Till Schloesser, Dresden (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/130,441

(22) PCT Filed: Nov. 14, 2000

(86) PCT No.: PCT/DE00/03982

§ 371 (c)(1),
(2), (4) Date: Aug. 6, 2002

(87) PCT Pub. No.: WO01/37342

PCT Pub. Date: May 25, 2001

(30) Foreign Application Priority Data

Nov. 15, 1999 (DE) ................ 199 54 869

(51) Int. Cl.
*H01L 27/108* (2006.01)
(52) U.S. Cl. ............... 257/302; 257/E27.091; 257/30; 257/300
(58) Field of Classification Search ........ 257/300, 257/302, 321, 329, 30, 36, 37, 38, 296, 297, 257/31, 328, E27.091, 39
See application file for complete search history.

(56) References Cited

U.S. PATENT DOCUMENTS

| | | | |
|---|---|---|---|
| 5,355,330 A | | 10/1994 | Hisamoto et al. |
| 5,949,103 A | | 9/1999 | Lee |
| 5,959,322 A | * | 9/1999 | Lee ............................ 257/298 |
| 6,060,723 A | * | 5/2000 | Nakazato et al. ............. 257/20 |
| 6,169,308 B1 | * | 1/2001 | Sunami et al. .............. 257/321 |

FOREIGN PATENT DOCUMENTS

| | | |
|---|---|---|
| EP | A-0 892 440 | 1/1999 |
| EP | A-0 908 954 | 4/1999 |
| JP | 08 097305 A | 4/1996 |

OTHER PUBLICATIONS

E. Snow et al, "A metal/oxide tunneling transistor", Applied Physics Letters, vol. 72, No. 23 1998, 3071.

* cited by examiner

*Primary Examiner*—Kenneth Parker
*Assistant Examiner*—Matthew Landau
(74) *Attorney, Agent, or Firm*—Altera Law Group, LLC

(57) ABSTRACT

The invention relates to a transistor that is provided with a first source/drain area (S/D1), a channel area (KA) adjacent thereto, a second source/drain area (S/D 2) adjacent thereto, a gate dielectric and a gate electrode. A first capacitor electrode (SP) of the capacitor is connected to the first source/drain area (S/D1). An insulating structure entirely surrounds an insulating area of the circuit arrangement. At least the first capacitor electrode (SP) and the first source/drain area (S/D1) are arranged in the insulating area. The second source/drain area (S/D2) and the second capacitor electrode of the capacitor are arranged outside the insulating area. The insulating structure prevents the first capacitor electrode (SP) from loosing charge through leaking currents between charging and discharging of the capacitor. A tunnel barrier (T) which is arranged in the channel area (KA) is part of the insulating structure. A capacitor dielectric (KD) that separates the first capacitor electrode (SP) from the second capacitor electrode is part of the insulating structure.

5 Claims, 6 Drawing Sheets

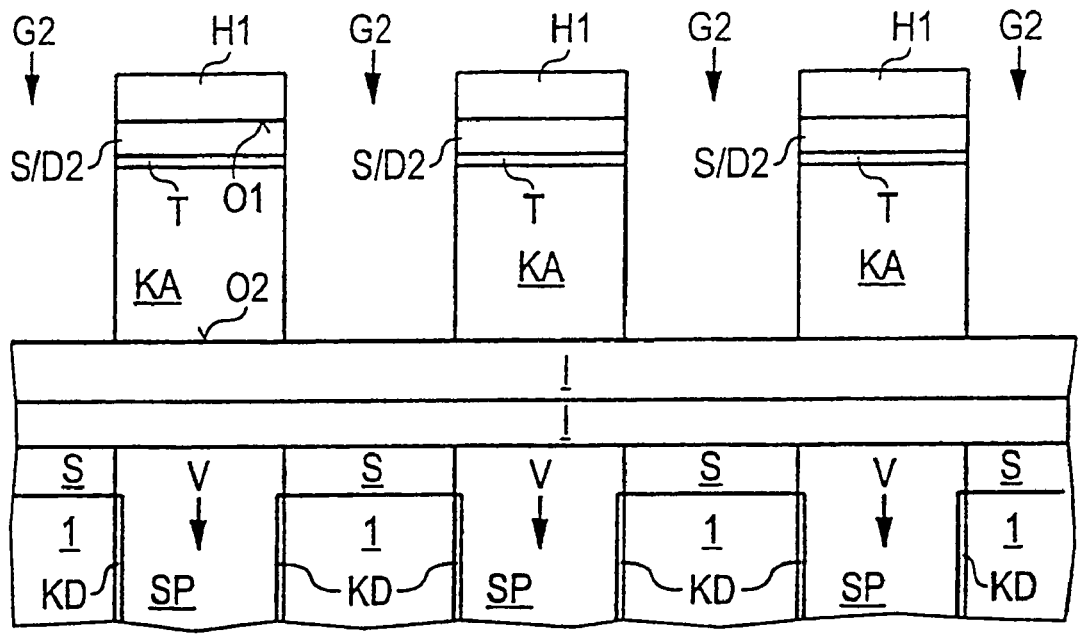
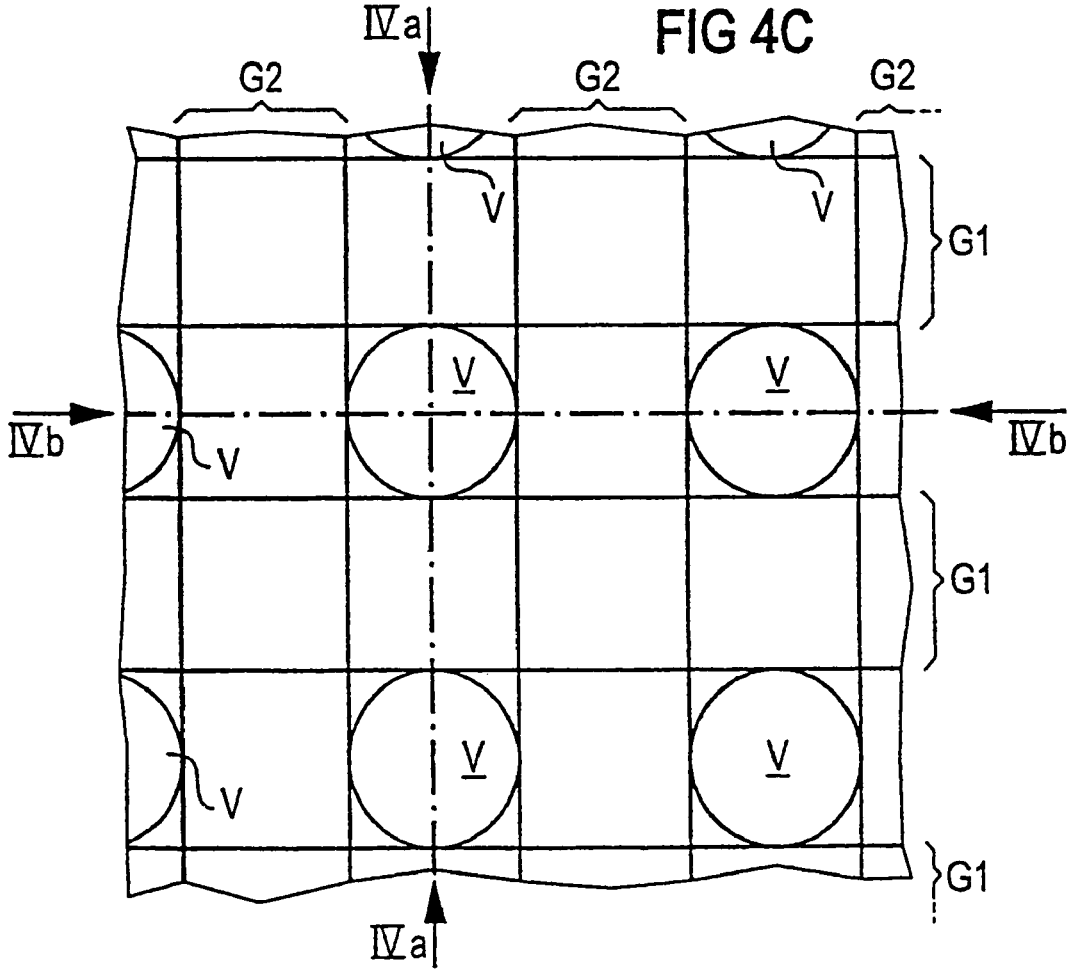

DRAM CELL STRUCTURE WITH TUNNEL BARRIER

The invention relates to a circuit arrangement having at least one capacitor and at least one transistor connected thereto.

Such a circuit arrangement is, for example, a DRAM cell arrangement having one-transistor memory cells. The memory cells each comprise a transistor and a capacitor connected thereto, on which the information is stored in the form of a charge. By driving the transistor via a word line, the charge on the capacitor can be read out via a bit line. Since the charge of the capacitor drives the bit line, the read-out signal on the bit line is larger the higher the charge which flows through the transistor during read-out. In order to increase this charge, attempts are currently being made to increase the capacitance of the capacitor. Since a high packing density of the DRAM cell arrangement is sought at the same time, capacitors with a small space requirement are proposed which, in order to enlarge their surface areas, have complicated three-dimensional bulges or which, in order to increase the dielectric constants of their capacitor dielectrics, in part comprise novel materials which are difficult to handle in terms of process engineering.

E. Snow et al. "A metal/oxide tunnelling transistor", Applied Physics Letters, Vol. 72, No. 23, 1998, 3071, describes a transistor having a first source/drain region, a second source/drain region and a channel region arranged in between. The entire channel region is filled by a tunnelling barrier made of insulating material. The first source/drain region and the second source/drain region are composed of metal. A gate dielectric of the transistor is arranged on the first source/drain region, the channel region and the second source/drain region. A gate electrode of the transistor is arranged on the gate dielectric. If a suitable voltage is applied to the gate electrode, then electrons can tunnel through the tunnelling barrier and current flows through the transistor.

The invention is based on the problem of specifying a circuit arrangement having at least one capacitor and at least one transistor connected thereto in which, given the same capacitance of the capacitor, in comparison with the prior art, more charge from the capacitor flows through the transistor when the transistor is opened.

The invention is based on the insight that charge on a capacitor is reduced on account of leakage currents between the charging and the actual discharging of the capacitor. The charge which flows through the transistor from the capacitor when the transistor is opened is thus smaller than the charge on the capacitor immediately after the capacitor has been charged.

The problem is solved by means of a circuit arrangement having at least one capacitor and at least one transistor connected thereto, in which the transistor has a first source/drain region, a channel region adjoining the latter, a second source/drain region adjoining the latter, a gate dielectric and a gate electrode. A first capacitor electrode of the capacitor is connected to the first source/drain region. An insulating structure completely surrounds an insulating region of the circuit arrangement. At least the first gate electrode and the first source/drain region are arranged in the insulating region. At least the second source/drain region and a second capacitor electrode of the capacitor are arranged outside the insulating region. A tunnelling barrier is part of the insulating structure and is arranged in the channel region. A capacitor dielectric isolates the first capacitor electrode from the second capacitor electrode and is part of the insulating structure.

Since the first source/drain region is arranged in the insulating region and the second source/drain region is arranged outside the insulating region and the channel region is arranged between the first source/drain region and the second source/drain region, the tunnelling barrier as part of the insulating structure cuts through the channel region. The transistor turns on if a suitable voltage is applied to the gate electrode, so that charge tunnels through the tunnelling carrier.

On account of the tunnelling barrier, the transistor has virtually no leakage current in the off state. Thus, between the charging and discharging of the capacitor, on account of the tunnelling barrier, the charge on the capacitor cannot flow away through the turned-off transistor in the form of leakage current. Since the insulating structure completely surrounds the first capacitor electrode, on which the charge is stored, and the first source/drain region connected thereto, it is also virtually impossible for charge to be lost otherwise by leakage currents. Since the charge is not reduced between charging and discharging, a particularly large amount of charge can flow through the transistor when it is opened.

By way of example, the transistor is arranged on an insulating layer, which is at least partly part of the insulating structure. The insulating layer isolates the transistor and thus the first source/drain region, too, from underlying material.

By way of example, the insulating layer is arranged on a substrate. The transistor may be arranged for example as a thin-film transistor on the insulating layer. To that end, a layer of polysilicon is arranged on the insulating layer. The first source/drain region and the second source/drain region are parts of the layer of polysilicon which are doped by a first conductivity type. The channel region is a part of the layer of polysilicon which is doped by a second conductivity type, opposite to the first conductivity type. The gate dielectric and the gate electrode are arranged on the layer of polysilicon. As an alternative, the transistor which is arranged on the insulating layer may be configured as follows: the first source/drain region and the second source/drain region may be composed of metal. The tunnelling barrier fills the entire channel region. The gate dielectric and the gate electrode are arranged at least on the channel region.

The transistor may be configured as a MOS transistor.

By way of example, the transistor is arranged in a thin layer of monocrystalline silicon which belongs to an SOI substrate. The insulating layer, which is part of the SOI substrate, is arranged below the thin layer of monocrystalline silicon and isolates the latter from the rest of the SOI substrate.

The substrate may also be an SOI-like substrate. By way of example, the substrate is actually two substrates made of silicon which are connected to one another in such a way that the insulating layer is arranged between them. In order to fabricate such an SOI-like substrate, by way of example, a first substrate is provided with a first partial layer made of insulating material and a second substrate is provided with a second partial layer made of insulating material. The two substrates are subsequently joined together in such a way that the two partial layers meet, and heated such that the insulating layer is produced from the two partial layers. One of the two substrates is subsequently thinned until only a thin layer of monocrystalline silicone remains on the insulating layer. In this case, the other of the two substrates acts as a carrier substrate.

By way of example, the capacitor is arranged above the insulating layer.

As an alternative, the second capacitor electrode and at least one part of the first capacitor electrode are arranged below the insulating layer. The insulating layer, for the connection of the first capacitor electrode to the first source/drain region, has at least one opening which cuts through the insulating layer.

A contact or a part of the first capacitor electrode may be arranged in the opening.

Such a capacitor may be arranged in a depression of a substrate.

The transistor may be configured as a planar transistor. In this case, the lower end of the tunnelling barrier adjoins the insulating layer. An upper end of the tunnelling barrier adjoins the gate dielectric.

In order to increase the packing density of the circuit arrangement, it is advantageous if the transistor is configured as a vertical transistor. The first source/drain region, the channel region and the second source/drain region are arranged one above the other. Either the first source/drain region is arranged above the second source/drain region, or vice versa.

If the first source/drain region and the second source/drain region are composed of metal, then the tunnelling barrier fills the entire channel region and adjoins the first source/drain region and the second source/drain region.

If the transistor is configured as a vertical MOS transistor, and if the second source/drain region is arranged above the first source/drain region, then the tunnelling barrier preferably adjoins the second source/drain region. A part of the channel region in which the tunnelling barrier is not arranged adjoins the tunnelling barrier and the first source/drain region. The tunnelling barrier is thus arranged on the part of the channel region which is preferably composed of monocrystalline silicon. This arrangement is significantly easier to produce than if the tunnelling barrier is arranged below a part of the channel region made of monocrystalline silicon, since it is difficult to produce monocrystalline silicon on insulating material.

If the tunnelling barrier adjoins the second source/drain region but not the first source/drain region, then the gate dielectric is part of the insulating structure. If the tunnelling barrier is arranged in the channel region without adjoining the first source/drain region or the second source/drain region, then a part of the gate dielectric which is arranged between the tunnelling barrier and the first source/drain region is part of the insulating structure. In both cases, a part of the channel region is arranged in the insulating region which is surrounded by the insulating structure.

The tunnelling barrier may adjoin the first source/drain region, wherein a part of the channel region in which the tunnelling barrier is not arranged adjoining the second source/drain region.

In order to increase the channel width of the vertical transistor, it is advantageous if the gate electrode annularly laterally surrounds the channel region.

The circuit arrangement is, for example, a DRAM cell arrangement having memory cells, the transistor and the capacitor being part of one of the memory cells. The memory cell is configured in such a way that information to be stored is stored in the form of a charge on the capacitor, and that, during the read-out of the information, the transistor is opened and charge flows from the capacitor through the transistor. The invention's configuration of the capacitor and transistor is particularly advantageous precisely for a memory cell arrangement since charge stored on the capacitor is not lost through leakage currents.

By way of example, the gate electrodes of the transistors of the memory cells are connected to word lines. The second capacitor electrodes of the capacitors of the memory cells are connected to bit lines running transversely with respect to the word lines. Thus, one transistor and one capacitor are provided per memory cell.

As an alternative, the second source/drain regions of the transistors of the memory cells and not the second capacitor electrodes are connected to the bit lines.

A further possible configuration of the memory cell is described below:

The memory cell comprises a memory transistor and the transistor, which are connected in series between the bit line and a voltage terminal. A diode is connected between a source/drain region of the memory transistor, which is connected to the transistor, and a gate electrode of the memory transistor. The first capacitor electrode of the capacitor is connected to the gate electrode of the memory transistor. The gate electrode of the transistor is connected to the word line running transversely with respect to the bit line. During the read-out of the information stored in the form of a charge on the capacitor, the transistor is opened, so that charge flows from the capacitor via the diode through the transistor. At the same time, charge flows between the voltage terminal and the bit line through the transistor and through the memory transistor if the latter is open given sufficient charge on the capacitor.

An exemplary embodiment of the invention is explained in more detail below with reference to the figures.

FIG. 4b shows a cross section, perpendicular from the cross section from FIG. 4a, through the two substrates after the process steps from FIG. 4a.

FIG. 4c shows a plan view of the two substrates illustrating the depressions, the first trenches and the second trenches.

FIG. 5b shows the cross section from FIG. 4b after the process steps from FIG. 5a.

FIG. 6b shows the cross section from FIG. 5b after the process steps from FIG. 6a.

The figures are not true to scale.

An exemplary embodiment is a DRAM cell arrangement. In order to illustrate the construction of the DRAM cell arrangement, a method for fabricating it is described below:

A first substrate 1 made of n-doped silicon and having a thickness of approximately 400 μm is provided. The dopant concentration is approximately $10^{20}$ cm$^{-3}$. In order to produce a protective layer S, silicon nitride is deposited to a thickness of approximately 50 nm (see FIG. 1).

Figure 1:
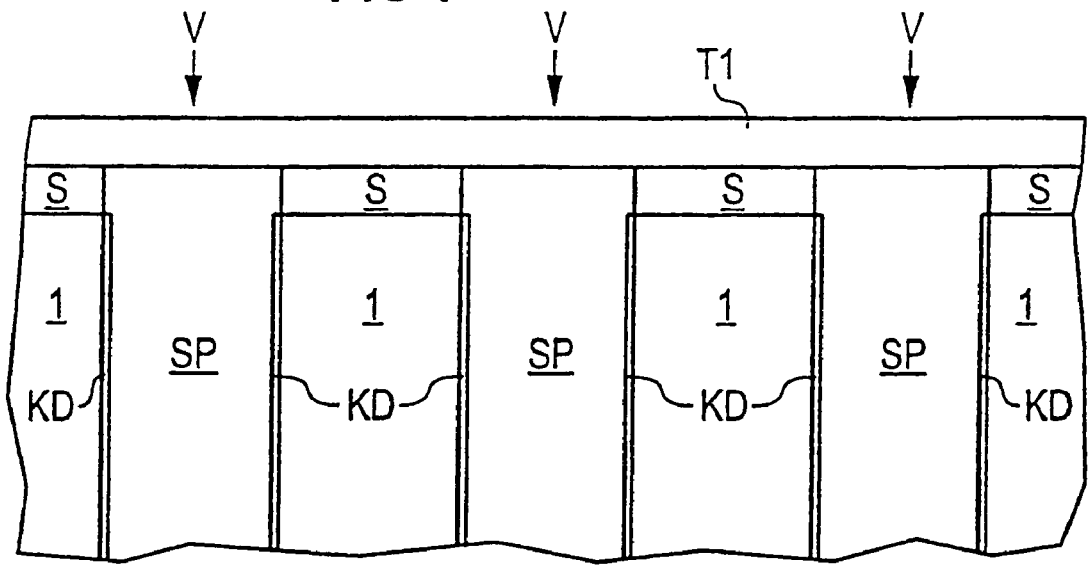
FIG. 1 shows a cross section through a first substrate after the production of a protective layer, depressions, a capacitor dielectric, first capacitor electrodes and a first partial layer of an insulating layer.

Depressions V having a depth of approximately 6 μm are produced in the first substrate 1 by masked etching (see FIG. 1). The depressions V have circular horizontal cross sections whose diameter is approximately 150 nm. The depressions V are arranged in rows and columns. Distances between mutually adjacent depressions V are approximately 150 nm.

In order to produce a capacitor dielectric KD of capacitors, silicon nitride is deposited to a thickness of approximately 5 nm and oxidized to a depth of approximately 2 nm by thermal oxidation (see FIG. 1).

In order to produce first capacitor electrodes SP of the capacitors, in situ n-doped polysilicon is deposited to a thickness of approximately 200 nm and planarized by chemical mechanical polishing until the protective layer S is uncovered (see FIG. 1). The first substrate 1 acts as the second capacitor electrode of all the capacitors.

In order to produce a first partial layer T1 of an insulating layer I, $SiO_2$ is deposited to a thickness of approximately 200 nm and planarized by chemical mechanical polishing. The first partial layer T1 of the insulating layer I has a thickness of approximately 100 nm.

Figure 2:
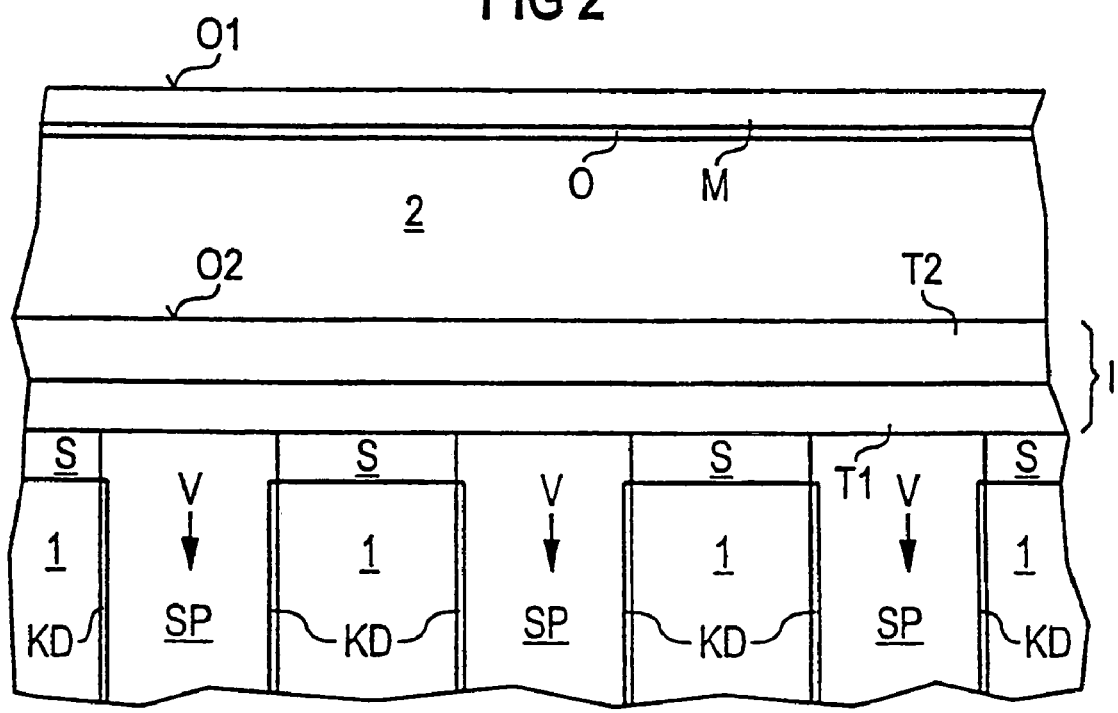
FIG. 2 shows the cross section from FIG. 1 and a cross section through a second substrate after a second partial layer of the insulating layer has been produced on the second substrate, the two substrates have been connected to one another, the second substrate has been thinned and a nitride layer and a layer of polysilicon have been produced.

A second substrate 2 made of p-doped silicon and having a thickness of approximately 400 μm is provided. The dopant concentration is approximately $10^{17}$ cm$^{-3}$. A second partial layer T2—approximately 100 nm thick—of the insulating layer I is applied on the second substrate 2 by $SiO_2$ being deposited to a thickness of approximately 200 nm and being planarized by chemical mechanical polishing (see FIG. 2).

The first substrate 1 and the second substrate 2 are stacked on top of one another in such a way that the first partial layer T1 lands on the second partial layer T2 of the insulating layer I. By means of a heat treatment step at approximately 900° C., the first partial layer T1 and the second partial layer T2 are permanently connected to one another and form the insulating layer I (see FIG. 2).

The second substrate 2 is subsequently thinned, the first substrate 1 acting as a stabilizing carrier plate. After thinning, the second substrate 2 has a thickness of approximately 900 nm (see FIG. 2).

A nitride layer O made of silicon nitride and having a thickness of approximately 3 nm is produced by deposition. In order to produce a layer made of polysilicon M, in situ n-doped polysilicon is deposited to a thickness of approximately 200 nm on the nitride layer O (see FIG. 2). The dopant concentration of the layer made of polysilicon M is approximately $10^{20}$ cm$^{-3}$. The second substrate 2 has the layer of polysilicon M at a first surface O1 and the insulating layer I at a surface O2, opposite to the first surface O1.

Figure 3:
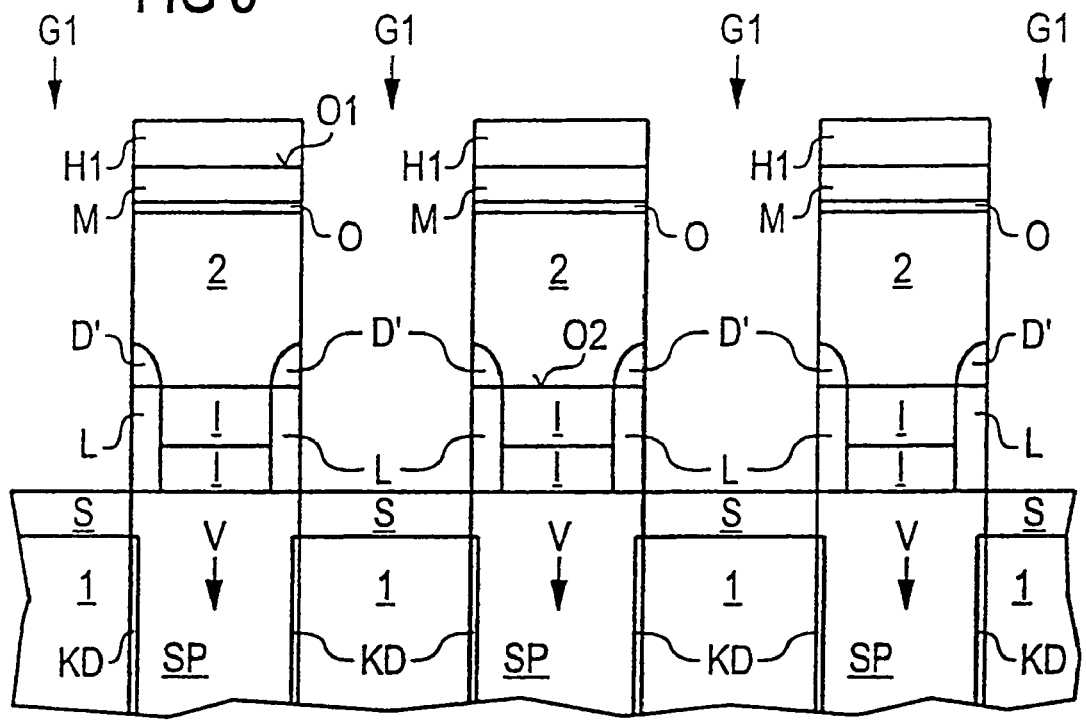
FIG. 3 shows the cross section from FIG. 2 after the production of a first auxiliary layer, first trenches, conductive structures and doped regions.

In order to produce a first auxiliary layer H1, silicon nitride is deposited to a thickness of approximately 100 nm on the layer of polysilicon M (see FIG. 3).

With the aid of a first trench mask made of photoresist (not illustrated), first trenches G1 are produced in the second substrate 2, which trenches firstly cut through the first auxiliary layer H1, the layer of polysilicon M, the nitride layer and the second substrate 2. $SiO_2$ is subsequently etched, so that the first trenches G1 are deepened in such a way that they cut through the insulating layer I (see FIG. 3).

Parts of the insulating layer I which adjoin sidewalls of the first trenches G1 are removed by isotropic etching of $SiO_2$ (see FIG. 3). HF, for example, is suitable as an etchant.

The removed parts of the insulating layer I are replaced by conductive structures L by in situ n-doped polysilicon being deposited to a thickness of approximately 50 nm and etched back until the protective layer S is uncovered (see FIG. 3).

An oxide (not illustrated) having a thickness of approximately 5 nm is subsequently produced by thermal oxidation. In this case, dopant diffuses from the conductive structures L into the second substrate 2, where it forms strip-type doped regions D (see FIG. 3).

Figure 4A:
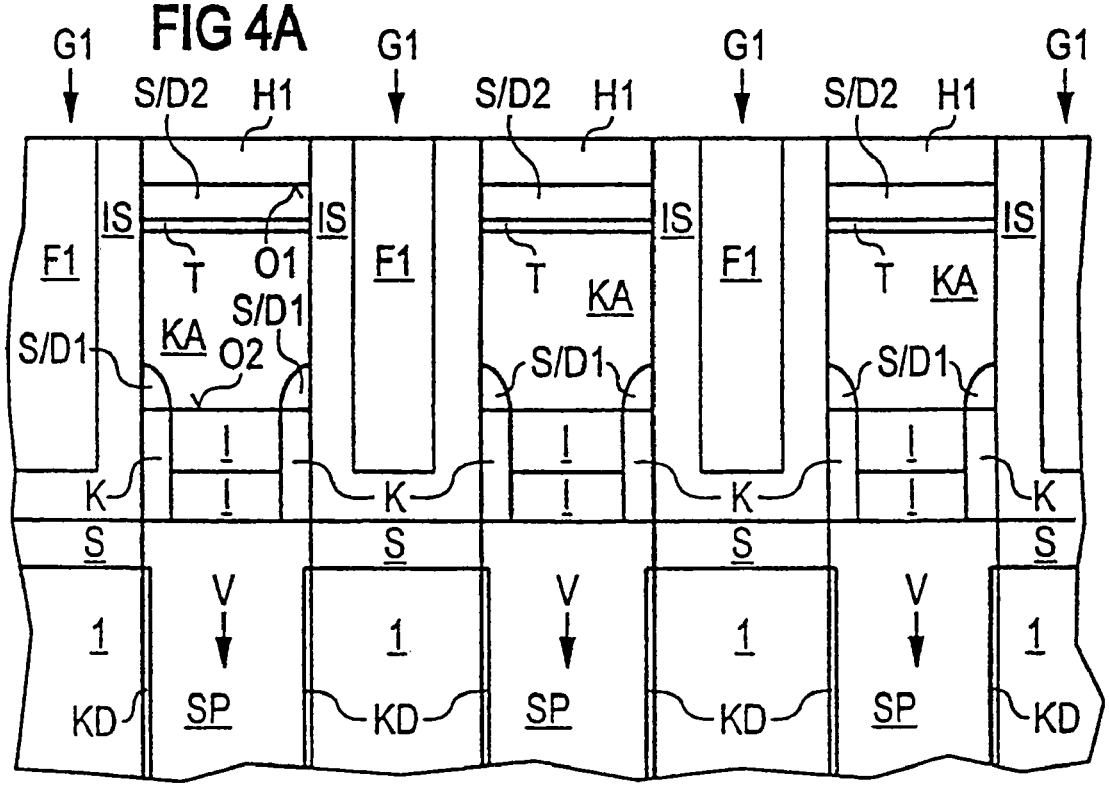
FIG. 4a shows the cross section from FIG. 3 after the production of insulations, first filling structures, second trenches (illustrated in FIG. 4b), first source/drain regions, second source/drain regions and contacts.

In order to produce insulations IS, silicon nitride is deposited to a thickness of approximately 50 nm. $SiO_2$ is subsequently deposited to a thickness of approximately 100 nm, so that the first trenches G1 are filled. $SiO_2$ and silicon nitride are removed by chemical mechanical polishing until the first auxiliary layer H1 is uncovered. As a result, the insulations IS are produced from the silicon nitride, which insulations are arranged in the first trenches G1, cover the side walls and the bottoms of the first trenches G1 and have parts which are opposite one another in the first trenches G1. In the first trenches G1, first filling structures F1 are produced from the $SiO_2$ (see FIG. 4a).

With the aid of a second trench mask made of photoresist, second trenches G2 are produced in the second substrate 2 by silicon nitride, polysilicon and $SiO_2$ being etched until the insulating layer I is uncovered (see FIGS. 4b and 4c).

First source/drain regions S/D1 of the transistors are produced from the doped regions D, which are patterned by the second trenches G2. Second source/drain regions S/D2 of transistors are produced from the layer of polysilicon M, which is patterned by the first trenches G1 and the second trenches G2. Tunnelling barriers T are produced from the nitride layer O, which is patterned by the first trenches G1 and the second trenches G2. Parts of the second substrate 2 which are arranged between the first source/drain regions S/D1 and the second source/drain regions S/D2 act as channel regions KA of the transistors. The tunnelling barriers T are arranged in the channel regions KA.

Through the second trenches G2, parts of the conductive structures L are uncovered at bottoms of the second trenches G2. These parts of the conductive structures L are removed by etching using e.g. He, HBr, $Cl_2$, $C_2F_6$. The conductive structures L are thereby patterned and form mutually isolated contacts K which in each case connect the first source/drain regions S/D1 to the underlying first capacitor electrodes SP (see FIG. 4a).

The removed parts of the conductive structures L are replaced by insulating material by $SiO_2$ being deposited to a thickness of approximately 150 nm, so that the second trenches G2 are filled, and being subjected to chemical mechanical planarization until the first auxiliary layer H1 is uncovered. The first auxiliary layer H1 is removed by etching using e.g. $CHF_3$, $O_2$. $SiO_2$ is subsequently etched back to a depth of approximately 300 nm, so that the bottoms of the second trenches G2 are at their original level again. During the etching-back of the $SiO_2$ the first filling structures F1 are also etched back, thereby forming a lattice-shaped depression which laterally surrounds the channel regions KA of the transistors.

A gate dielectric GD having a thickness of approximately 5 nm is produced on uncovered areas of the channel regions KA by thermal oxidation. The gate dielectric GD is arranged on parts of the sidewalls of the second trenches G2 (see FIG. 5b).

In order to produce word lines W1, in situ n-doped polysilicon is deposited to a thickness of approximately 50 nm, so that the first trenches G1 are filled, while the second trenches G2 are not filled. Polysilicon is subsequently etched back to an extent of approximately 100 nm until the bottoms of the second trenches G2 are uncovered. The word lines W1 are thereby produced from the polysilicon (see FIGS. 5a and 5b).

Figure 5A:
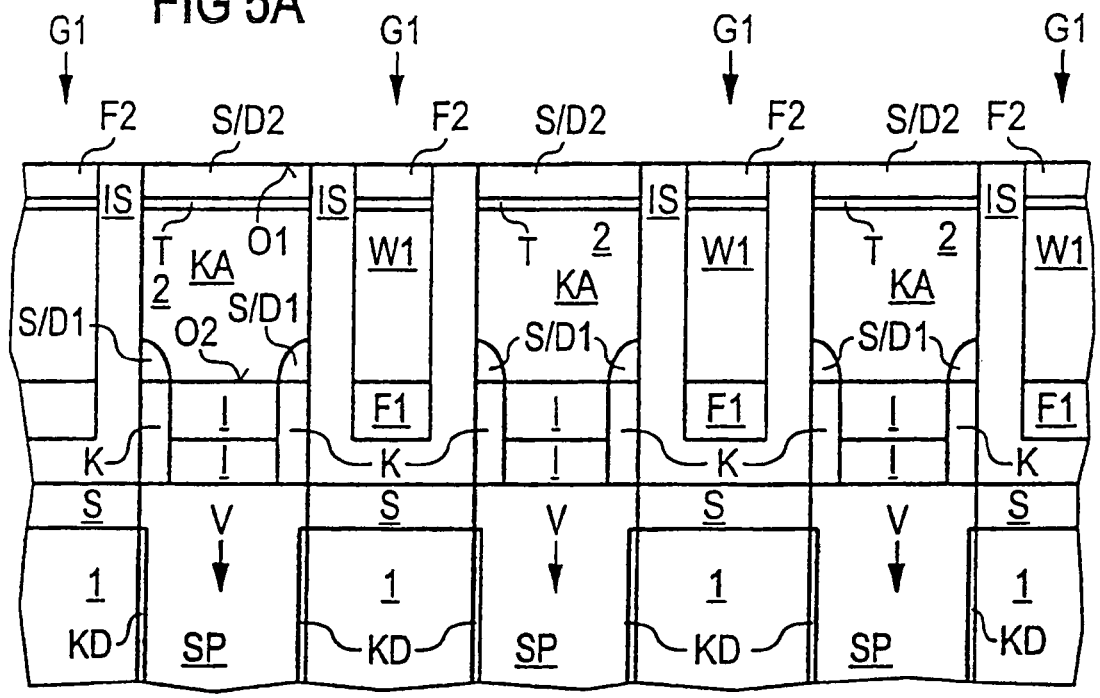
FIG. 5a shows the cross section from FIG. 4a after the first auxiliary layer has been removed and a gate dielectric (illustrated in FIG. 5b), word lines and second filling structures have been produced.
Figure 5B:
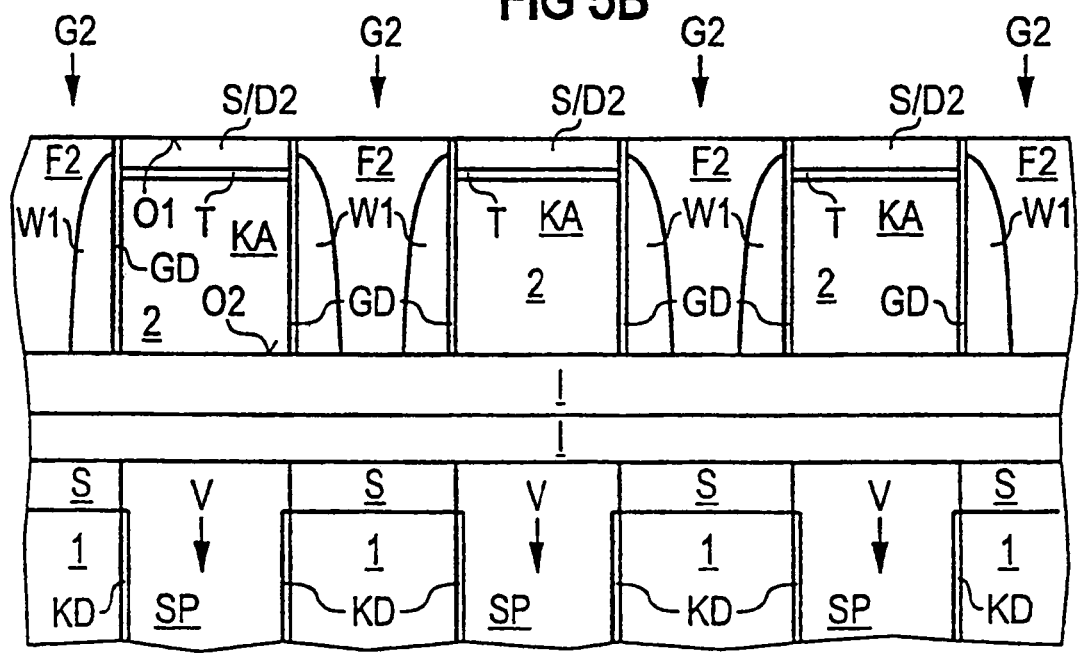

In order to produce second filling structures F2, $SiO_2$ is deposited to a thickness of approximately 100 nm and planarized by chemical mechanical polishing until the second source/drain regions S/D2 are uncovered (see FIGS. 5a and 5b).

In order to produce bit lines B, tungsten is deposited to a thickness of approximately 100 nm. Silicon nitride is deposited over that to a thickness of approximately 50 nm in order to produce a second auxiliary layer H2.

Figure 6A:
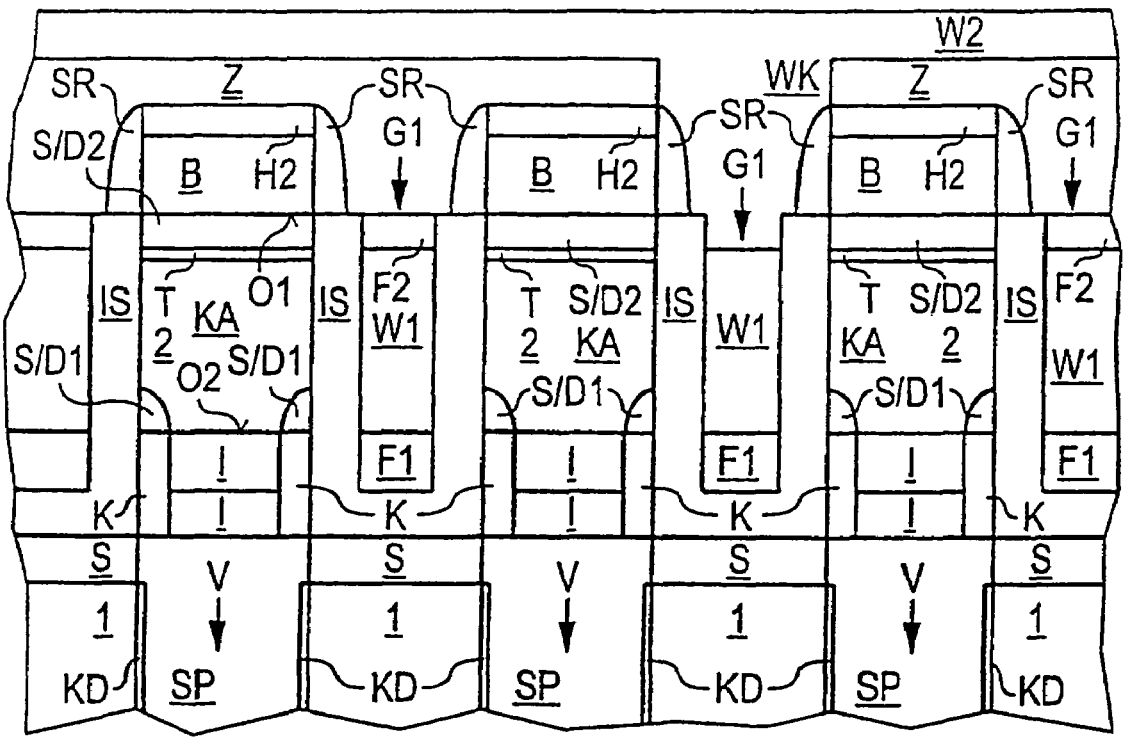
FIG. 6a shows the cross section from FIG. 5a after the production of bit lines, insulating spacers, a second auxiliary layer, an intermediate oxide, word line contacts and lines.
Figure 6B:
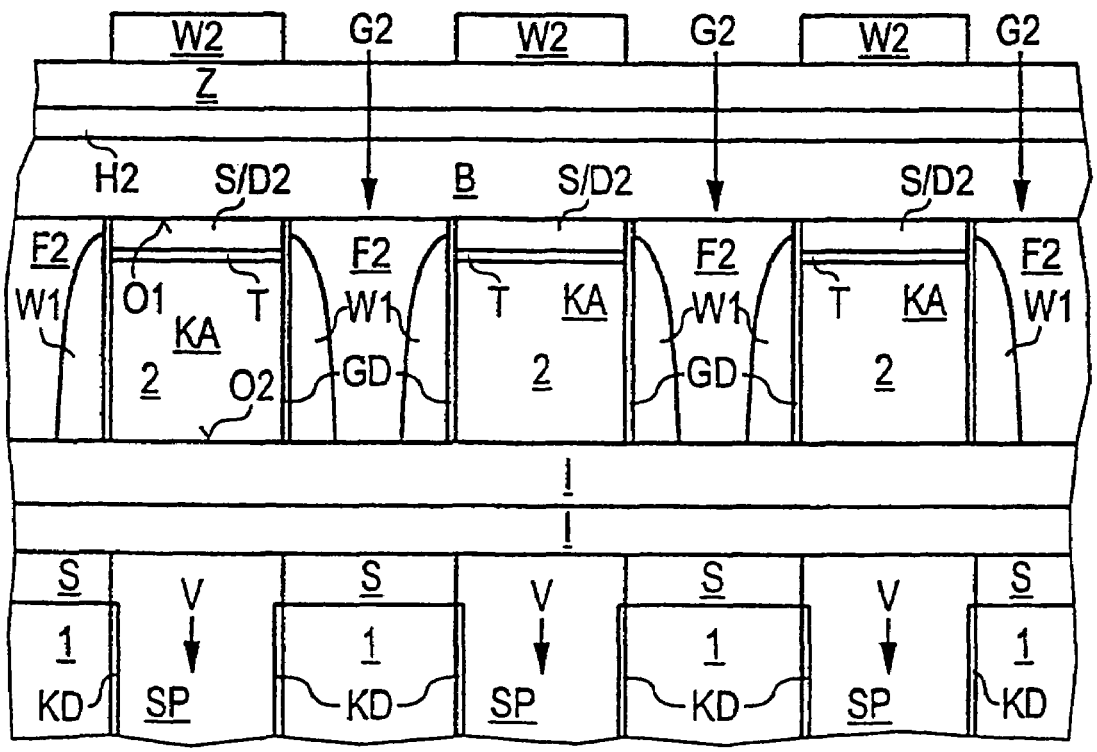
Figure 6C:
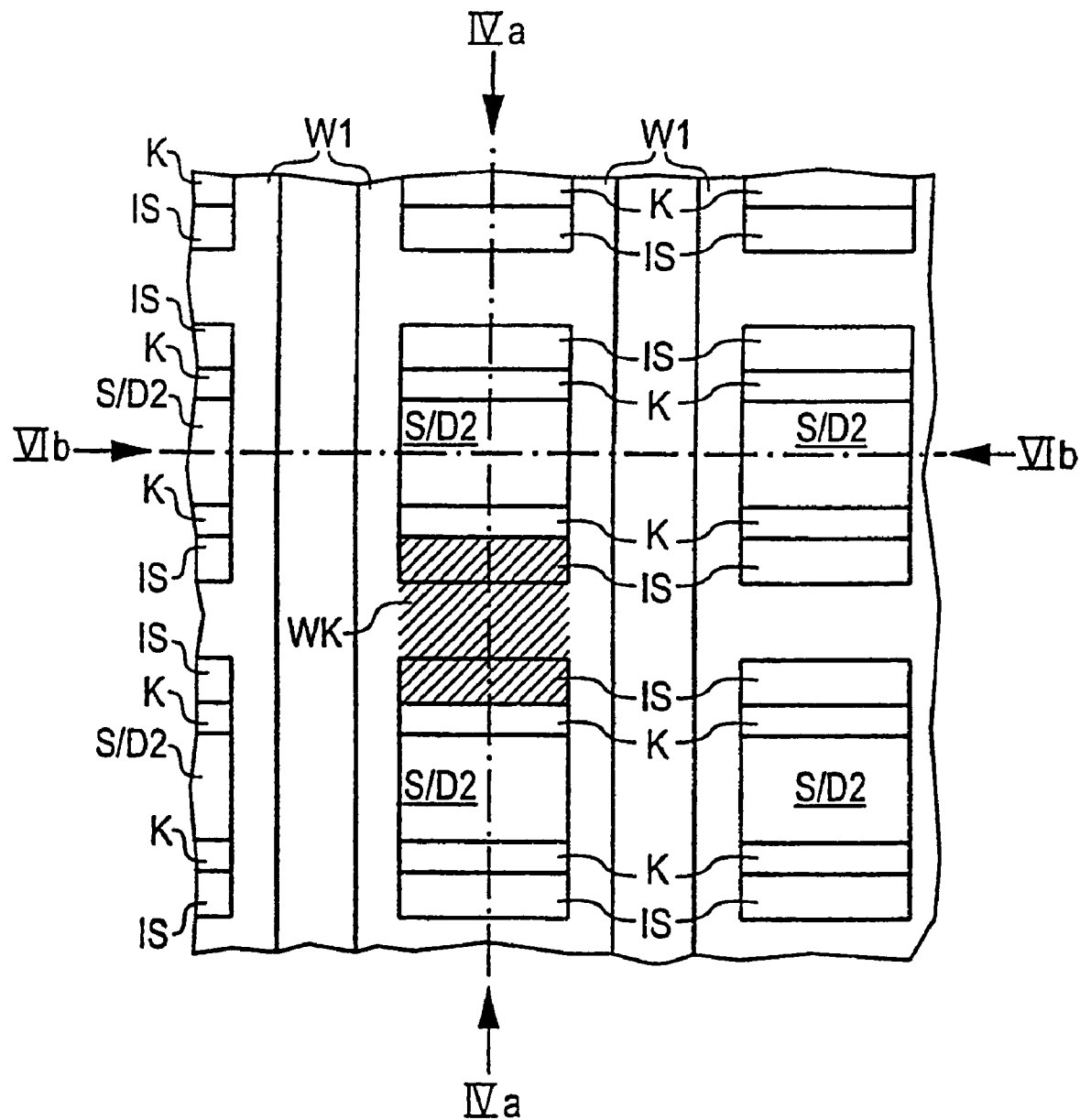
FIG. 6c shows the plan view from FIG. 4c illustrating the contacts, the second source/drain regions, parts of the insulations which are arranged on the sidewalls of the first trenches, the word lines and a word line contact.

The second auxiliary layer H2 and the tungsten are patterned with the aid of a mask made of photoresist, so that the bit lines B are produced from the tungsten, holes are filled with the word line contacts WK. Tungsten is patterned with the aid of a mask made of photoresist (not illustrated), thereby producing lines W2 running parallel to the word lines W1 (see FIGS. 6a and 6b and 6c).

The method described produces a DRAM cell arrangement in which a memory cell comprises a transistor and a capacitor connected thereto. The following holds true for each memory cell: the first capacitor electrode SP, a part of the channel region KA which is composed of silicon, the first source/drain region S/D1 and the contacts K are completely surrounded by an insulating structure which comprises the capacitor dielectric KD, the tunnelling barrier T, the gate dielectric, the insulating layer I, the insulations IS and the protective layer S, and thus form an insulated region.

There are many conceivable variations of the exemplary embodiment which likewise lie within the scope of the invention. Thus, dimensions of the described layers, regions, structures, lines and contacts can be adapted to the respective requirements.

The invention claimed is:

1. A circuit, comprising:
at least one vertical transistor having a first source/drain region, a channel region arranged above the first source/drain region and adjoining the first source/drain region, a second source/drain region, arranged above the channel, a gate dielectric and a gate electrode; exactly one tunnel barrier layer arranged such that the second source/drain region is separated from the channel region only by the exactly one tunnel barrier layer;
at least one capacitor having a first capacitor electrode arranged below the channel in a manner to be vertically opposite to the second source/drain region and connected to the first source/drain region by means of a conductive structure; and
an insulating structure including the exactly one tunneling barrier layer, a capacitor dielectric and an insulation layer, the insulation layer being arranged above the first electrode in a manner to be vertically between the channel and the first electrode, whereby the insulating structure surrounds a portion of the at least one vertical transistor and the at least one capacitor and defining an insulating region, with at least the first capacitor electrode and the first source/drain region arranged in the insulating region, and at least the second source/drain region and a second capacitor electrode of the capacitor arranged outside the insulating region, the exactly one tunneling barrier layer arranged between the channel region and the second source/drain region, the gate electrode surrounds the channel region in such a way that the tunneling barrier is controllable, and the capacitor dielectric isolates the first capacitor electrode from the second capacitor electrode, and the conductive structure adjoining the side wall of the insulating layer.

2. A circuit according to claim 1, further comprising the part of the channel region in which the tunneling barrier is not arranged adjoins the tunneling barrier and the first source/drain region.

3. A circuit according to claim 1, further comprising a DRAM cell arrangement having memory cells, wherein the transistor and the capacitor are part of one of the memory cells.

4. A circuit according to claim 3, further comprising:
word lines, the word lines being connected to the gate electrodes of the transistor of the memory cells; and
bit lines, the bit lines being connected to the second capacitor electrodes of the capacitors of the memory cells, said bit lines running transversely with respect to the word lines.

5. A circuit according to claim 1, in which the transistor is configured as a MOS transistor.

* * * * *